United States Patent
Gangi et al.

(10) Patent No.: US 11,824,111 B2
(45) Date of Patent: Nov. 21, 2023

(54) SEMICONDUCTOR DEVICE

(71) Applicant: KABUSHIKI KAISHA TOSHIBA, Tokyo (JP)

(72) Inventors: Hiro Gangi, Ota (JP); Tomoaki Inokuchi, Yokohama (JP); Yusuke Kobayashi, Nagareyama (JP); Hiroki Nemoto, Fuchu (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/394,765

(22) Filed: Aug. 5, 2021

(65) Prior Publication Data

US 2022/0115533 A1     Apr. 14, 2022

(30) Foreign Application Priority Data

Oct. 8, 2020   (JP) ................. 2020-170552

(51) Int. Cl.
*H01L 29/78*     (2006.01)
*H01L 27/088*    (2006.01)

(52) U.S. Cl.
CPC ........ *H01L 29/7813* (2013.01); *H01L 27/088* (2013.01)

(58) Field of Classification Search
CPC . H01L 29/7813; H01L 27/088; H01L 29/401; H01L 29/404; H01L 29/66727; H01L 29/41766; H01L 29/407; H01L 29/66734; H01L 29/4236; H01L 29/42352; H01L 29/66613–66628; H01L 29/0696; H01L 29/1095; H01L 29/7375;

(Continued)

(56) References Cited

U.S. PATENT DOCUMENTS 9,337,283 B2     5/2016   Nishiguchi
2010/0264486 A1  10/2010  Denison et al.
(Continued)

FOREIGN PATENT DOCUMENTS

JP   2002-203964 A   7/2002
JP   2013-062344 A   4/2013
JP   2014-187182 A   10/2014

*Primary Examiner* — Cuong B Nguyen
(74) *Attorney, Agent, or Firm* — Oblon, McClelland, Maier & Neustadt, L.L.P.

(57) ABSTRACT

According to one embodiment, a semiconductor device includes first to third electrodes, a conductive member, a semiconductor member, and an insulating member. The second electrode includes a conductive portion. The conductive portion is between the third electrode and the conductive member. The conductive member is electrically connected with the second electrode. The semiconductor member includes first to third semiconductor regions. The second semiconductor region is between the third semiconductor region and a portion of the first semiconductor region. The second semiconductor region is between the third electrode and the conductive member. The conductive portion is electrically connected with the second and third semiconductor regions. The first electrode is electrically connected with the first semiconductor region. At least a portion of the first insulating member is between the semiconductor member and the third electrode and between the semiconductor member and the first conductive member.

12 Claims, 14 Drawing Sheets

(58) Field of Classification Search
CPC ... H01L 29/7393–7395; H01L 29/7397; H01L 29/66325; H01L 29/66333–66348
See application file for complete search history.

(56) References Cited

U.S. PATENT DOCUMENTS

| | | |
|---|---|---|
| 2012/0080748 A1 | 4/2012 | Hsieh |
| 2013/0062688 A1 | 3/2013 | Kobayashi |
| 2013/0334565 A1* | 12/2013 | Hutzler ............. H01L 21/76889 |
| | | 257/E29.198 |
| 2015/0228736 A1* | 8/2015 | Sakakibara ......... H01L 29/7395 |
| | | 257/330 |

* cited by examiner

SEMICONDUCTOR DEVICE

CROSS-REFERENCE TO RELATED APPLICATIONS

This application is based upon and claims the benefit of priority from Japanese Patent Application No. 2020-170552, filed on Oct. 8, 2020; the entire contents of which are incorporated herein by reference.

FIELD

Embodiments described herein relate generally to a semiconductor device.

BACKGROUND

For example, it is desirable to reduce the loss of a semiconductor device such as a transistor or the like.

DETAILED DESCRIPTION

Figure 1:
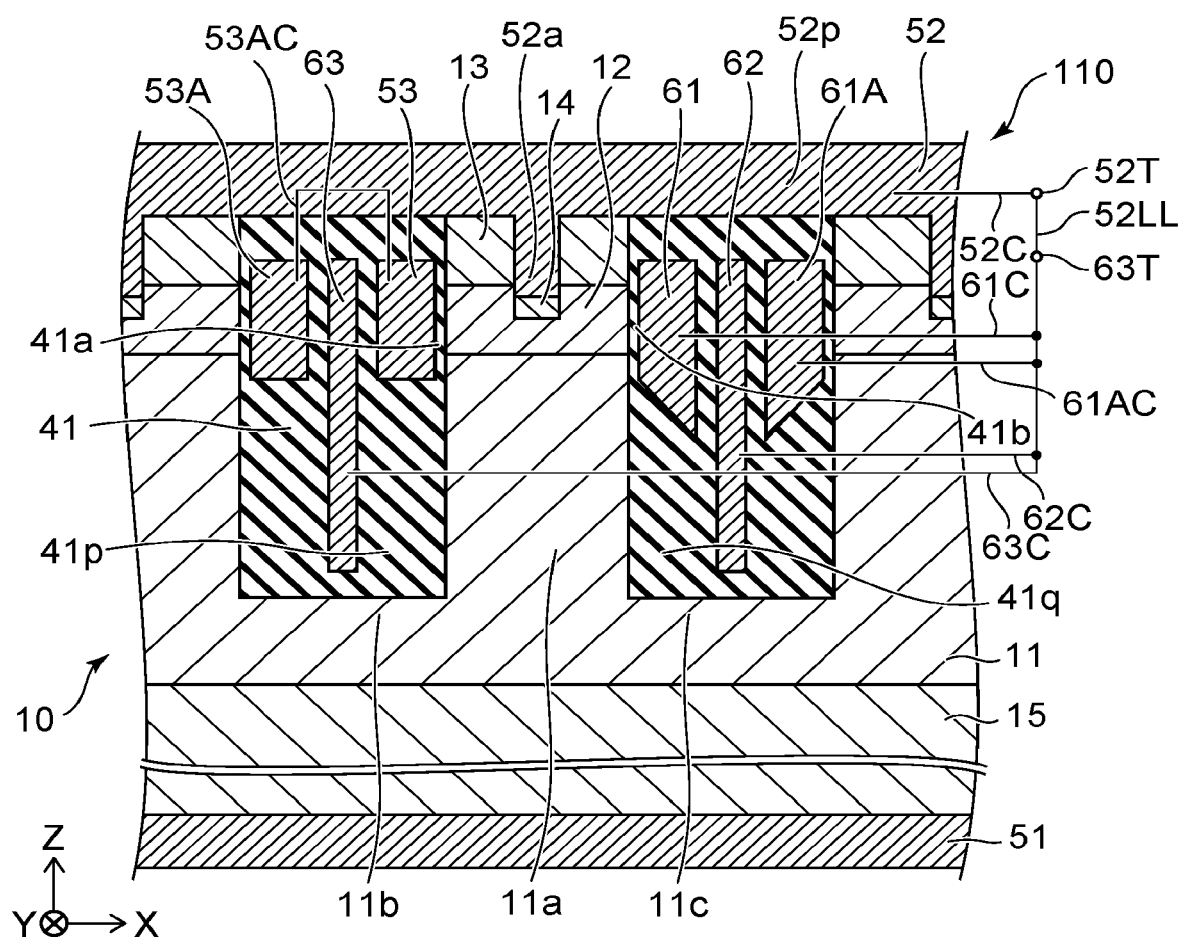
FIG. 1 is a schematic cross-sectional view illustrating a semiconductor device according to a first embodiment.

According to one embodiment, a semiconductor device includes a first electrode, a second electrode, a third electrode, a first conductive member, a semiconductor member, and a first insulating member. The second electrode includes a first conductive portion. A direction from the first electrode toward the first conductive portion is along a first direction. A second direction from the third electrode toward the first conductive member crosses the first direction. A position of the first conductive portion in the second direction is between a position of the third electrode in the second direction and a position of the first conductive member in the second direction. The first conductive member is electrically connected with the second electrode or is electrically connectable with the second electrode. The semiconductor member includes a first semiconductor region of a first conductivity type, a second semiconductor region of a second conductivity type, and a third semiconductor region of the first conductivity type. The second semiconductor region is between the third semiconductor region and a portion of the first semiconductor region in the first direction. The second semiconductor region is between the third electrode and the first conductive member in the second direction. The first conductive portion is electrically connected with the second and third semiconductor regions. The first electrode is electrically connected with the first semiconductor region. At least a portion of the first insulating member is between the semiconductor member and the third electrode and between the semiconductor member and the first conductive member. The first conductive member includes a first end portion and a first other-end portion. The first end portion is between the first electrode and the first other-end portion in the first direction. The third electrode includes a second end portion and a second other-end portion. The second end portion is between the first electrode and the second other-end portion in the first direction. A first distance along the first direction between the first electrode and the first end portion is less than a second distance along the first direction between the first electrode and the second end portion.

According to one embodiment, a semiconductor device includes a first electrode, a second electrode, a third electrode, a semiconductor member, and a first insulating member. The second electrode includes a first conductive portion, a second conductive portion, and a third conductive portion. The third conductive portion is between the first electrode and the first conductive portion in a first direction. The second conductive portion is between the third conductive portion and the first conductive portion in the first direction. A third width of the third conductive portion along a second direction crossing the first direction is less than a first width along the second direction of the first conductive portion. A second width along the second direction of the second conductive portion is between the first width and the third width. The second width decreases along an orientation from the first conductive portion toward the third conductive portion. The semiconductor member includes a first semiconductor region of a first conductivity type, a second semiconductor region of a second conductivity type, a third semiconductor region of the first conductivity type, and a fourth semiconductor region of the second conductivity type. The second semiconductor region is between the third semiconductor region and a portion of the first semiconductor region in the first direction. The second semiconductor region is between the third electrode and the first conductive portion in the second direction. The fourth semiconductor region is between the second semiconductor region and the first conductive portion in the second direction. An impurity concentration of the second conductivity type in the fourth semiconductor region is greater than an impurity concentration of the second conductivity type in the second semiconductor region. The first conductive portion is electrically connected with the fourth and third semiconductor regions. The first electrode is electrically connected with the first semiconductor region. At least a portion of the first insulating member is between the semiconductor member and the third electrode, between the semiconductor member and the second conductive portion, and between the semiconductor member and the third conductive portion. The second conductive portion includes a first end portion at the first electrode side. The third electrode includes a second end portion and a second other-end portion. The second end portion is between the first electrode and the second other-end portion in the first direction. A first distance along the first direction between the first electrode and the first end portion is less than a second distance along the first direction between the first electrode and the second end portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 2:
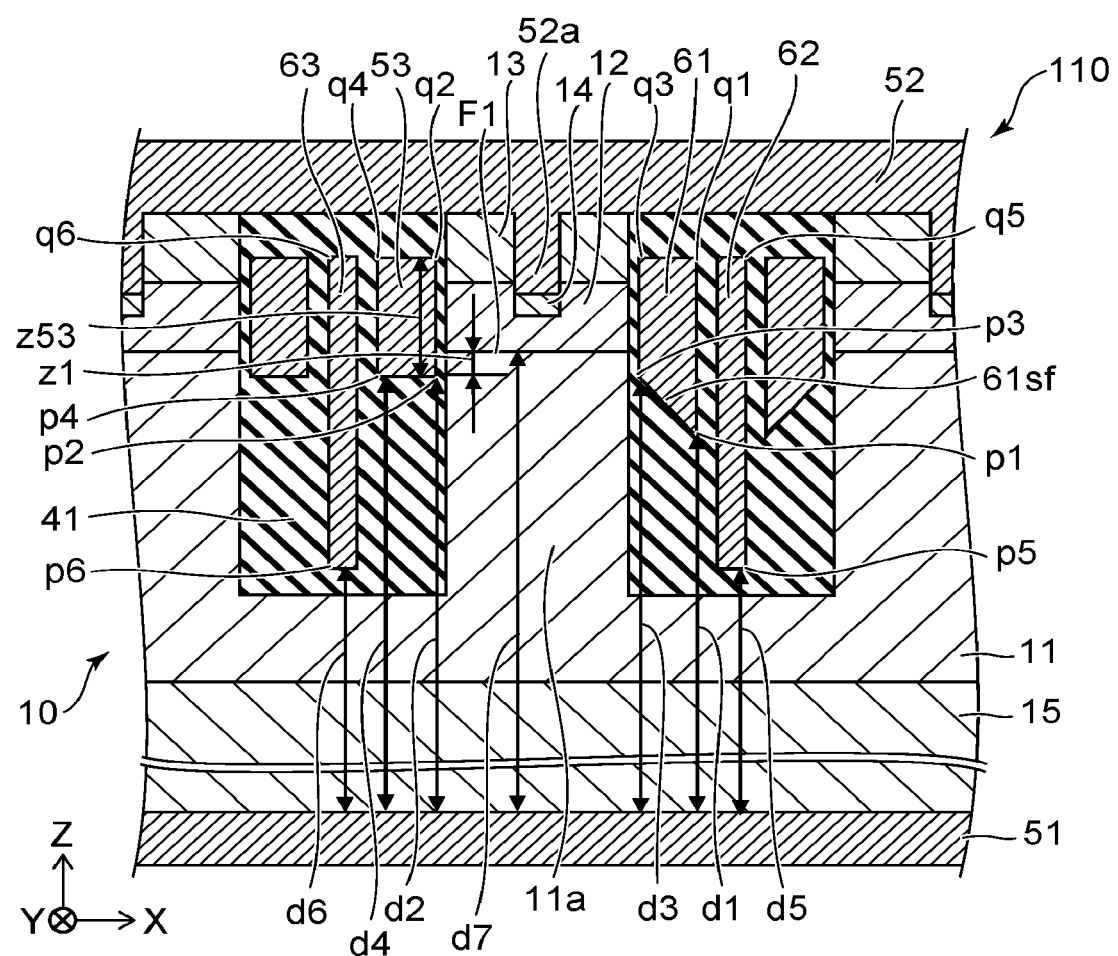
FIG. 2 is a schematic cross-sectional view illustrating the semiconductor device according to the first embodiment.

FIGS. 1 and 2 are schematic cross-sectional views illustrating a semiconductor device according to a first embodiment.

As shown in FIG. 1, the semiconductor device 110 according to the embodiment includes a first electrode 51, a second electrode 52, a third electrode 53, a first conductive member 61, a semiconductor member 10, and a first insulating member 41.

The second electrode 52 includes a first conductive portion 52a. The direction from the first electrode 51 toward the first conductive portion 52a is along a first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

A second direction from the third electrode 53 toward the first conductive member 61 crosses the first direction. For example, the second direction is the X-axis direction. The position of the first conductive portion 52a in the second direction is between the position of the third electrode 53 in the second direction and the position of the first conductive member 61 in the second direction.

The first conductive member 61 is electrically connected with the second electrode 52. Or, the first conductive member 61 is electrically connectable with the second electrode 52. For example, the first conductive member 61 is electrically connected with the second electrode 52 by a connection member 61C, a connection member 52C, an interconnect 52LL, etc. For example, a terminal 63T that is electrically connected with the first conductive member 61 may be provided, and a terminal 52T that is electrically connected with the second electrode 52 may be provided. These terminals may be electrically connected to each other by the interconnect 52LL. These terminals may be included in the semiconductor device 110. The interconnect 52LL may be provided separately from the semiconductor device 110.

The semiconductor member 10 includes a first semiconductor region 11 of a first conductivity type, a second semiconductor region 12 of a second conductivity type, and a third semiconductor region 13 of the first conductivity type. For example, the first conductivity type is an n-type; and the second conductivity type is a p-type. According to the embodiment, the first conductivity type may be the p-type; and the second conductivity type may be the n-type. Hereinbelow, the first conductivity type is taken to be the n-type; and the second conductivity type is taken to be the p-type.

The second semiconductor region 12 is between the third semiconductor region 13 and a portion 11a of the first semiconductor region 11 in the first direction (the Z-axis direction). The first semiconductor region 11 may include a partial region 11b and a partial region 11c. The direction from the partial region 11b toward the third electrode 53 is along the first direction. The direction from the partial region 11c toward the first conductive member 61 is along the first direction.

The second semiconductor region 12 is between the third electrode 53 and the first conductive member 61 in the second direction (e.g., the X-axis direction). The first conductive portion 52a is electrically connected with the second and third semiconductor regions 12 and 13. The first electrode 51 is electrically connected with the first semiconductor region 11.

At least a portion of the first insulating member 41 is between the semiconductor member 10 and the third electrode 53 and between the semiconductor member 10 and the first conductive member 61. For example, the first insulating member 41 includes a first insulating region 41a and a second insulating region 41b. The first insulating region 41a is between the third electrode 53 and the second semiconductor region 12. The second insulating region 41b is between the second semiconductor region 12 and the first conductive member 61.

In the example, the semiconductor member 10 includes a fourth semiconductor region 14 and a fifth semiconductor region 15. The fourth semiconductor region 14 is of the second conductivity type. The fourth semiconductor region 14 is between the first conductive portion 52a and at least a portion of the second semiconductor region 12. The second-conductivity-type impurity concentration in the fourth semiconductor region 14 is greater than the second-conductivity-type impurity concentration in the second semiconductor region 12. The second semiconductor region 12 is, for example, a p-region. The fourth semiconductor region 14 is, for example, a $p^+$-region. By providing the fourth semiconductor region 14, for example, the potential of the second semiconductor region 12 stabilizes easily.

The fifth semiconductor region 15 is located between the first electrode 51 and the first semiconductor region 11. The fifth semiconductor region 15 is of the first conductivity type. The first-conductivity-type impurity concentration in the fifth semiconductor region 15 is greater than the first-conductivity-type impurity concentration in the first semiconductor region 11. The first semiconductor region 11 is, for example, an n-region or an $n^-$-region. The fifth semiconductor region 15 is, for example, an $n^+$-region. By providing the fifth semiconductor region 15, the first electrode 51 and the first semiconductor region 11 are electrically connected with a low resistance. For example, a low on-resistance is obtained. The fifth semiconductor region 15 may be, for example, a semiconductor substrate.

The first-conductivity-type impurity concentration in the third semiconductor region 13 is greater than the first-conductivity-type impurity concentration in the first semiconductor region 11. The third semiconductor region 13 is, for example, an n⁺-region. For example, a low on-resistance is obtained because the first-conductivity-type impurity concentration in the third semiconductor region 13 is high.

The current that flows between the first electrode 51 and the second electrode 52 can be controlled by the potential of the third electrode 53. The first electrode 51 is, for example, a drain electrode. The second electrode 52 is, for example, a source electrode. The third electrode 53 is, for example, a gate electrode. For example, the first insulating region 41a functions as a gate insulating film. The semiconductor device 110 is, for example, a transistor. The portion 11a of the first semiconductor region 11 is, for example, the drift region. The second semiconductor region 12 is, for example, a base region. The third semiconductor region 13 is, for example, a source region.

For example, the first conductive member 61 functions as a field plate. The concentration of the electric field is suppressed by providing the field plate. For example, a high breakdown voltage is easily obtained.

For example, the fifth semiconductor region 15 is located on the first electrode 51. The first semiconductor region 11 is located on the fifth semiconductor region 15. The second semiconductor region 12 is located on a portion of the first semiconductor region 11. The third semiconductor region 13 is located on the second semiconductor region 12. In the example, the fourth semiconductor region 14 is located on a portion of the second semiconductor region 12. The first conductive portion 52a is located on the fourth semiconductor region 14. In the example, the second electrode 52 includes a conductive portion 52p. A portion of the first insulating member 41 is located between the third electrode 53 and the conductive portion 52p. Another portion of the first insulating member 41 is located between the first conductive member 61 and the conductive portion 52p.

As shown in FIG. 2, the first conductive member 61 according to the embodiment includes a first end portion p1 and a first other-end portion q1. The first end portion p1 is between the first electrode 51 and the first other-end portion q1 in the first direction (the Z-axis direction). The first end portion p1 is, for example, the lower end portion of the first conductive member 61. The first other-end portion q1 is, for example, the upper end of the first conductive member 61.

The third electrode 53 includes a second end portion p2 and a second other-end portion q2. The second end portion p2 is between the first electrode 51 and the second other-end portion q2 in the first direction (the Z-axis direction). The second end portion p2 is, for example, the lower end portion of the third electrode 53. The second other-end portion q2 is, for example, the upper end of the third electrode 53.

As shown in FIG. 2, the distance along the first direction (the Z-axis direction) between the first electrode 51 and the first end portion p1 is taken as a first distance d1. The distance along the first direction between the first electrode 51 and the second end portion p2 is taken as a second distance d2. The first distance d1 is less than the second distance d2. For example, the lower end portion of the first conductive member 61 is lower than the lower end portion of the third electrode 53. It was found that a practical semiconductor device in which the loss can be suppressed is obtained by such a configuration.

For example, a first reference example may be considered in which the third electrode 53 is also located at the position of the first conductive member 61. The loss is large in the first reference example. The loss is dependent on a parameter Ron•Qgd. The parameter Ron•Qgd is the product of "Ron" and "Qgd". "Ron" corresponds to the resistance between the drain and the source when conducting. "Qgd" corresponds to the charge that is necessary to charge the capacitance between the gate and the drain. When "Qgd" is large, the switching is slow, and the turn-on loss and the turn-off loss increase. It is difficult to reduce the parameter Ron•Qgd in the first reference example.

For example, in the first reference example such as that described above, it is considered that the first conductive member 61 may be provided instead of a portion of the multiple third electrodes 53. In such a case, "Qgd" can be reduced because the number of gates is small. On the other hand, the total of the gates is reduced; therefore, it is predicted that the density of the channel will be reduced, and "Ron" will be increased. However, it was found that the amount of the decrease of "Qgd" is greater than the amount of the increase of "Ron", and as a result, the parameter Ron•Qgd can be reduced.

A second reference example may be considered in which the first conductive member 61 is provided, and the configuration of the first conductive member 61 is the same as the configuration of the third electrode 53. In the second reference example, the potential of the first conductive member 61 is different from the potential of the third electrode 53; therefore, the electric field is asymmetric in the region between the first conductive member 61 and the third electrode 53. Therefore, it was found that a region occurs in which the electric field is locally high.

According to the embodiment, the configuration (the shape) of the first conductive member 61 is different from the configuration (the shape) of the third electrode 53. For example, the first distance d1 is less than the second distance d2; and the lower end portion of the first conductive member 61 is lower than the lower end portion of the third electrode 53. It was found that such a configuration can reduce the parameter Ron•Qgd while suppressing the concentration of the electric field. According to the embodiment, a practical semiconductor device can be provided in which the loss can be suppressed.

In one example, the difference between the first distance d1 and the second distance d2 is not less than 0.1 times and not more than 5 times a length z53 along the first direction (the Z-axis direction) of the third electrode 53 (referring to FIG. 2). The concentration of the electric field can be effectively suppressed by setting the difference between the first distance d1 and the second distance d2 to be somewhat large.

As shown in FIG. 2, the semiconductor member 10 includes a boundary F1 between the portion 11a of the first semiconductor region 11 and the second semiconductor region 12. The distance along the first direction (the Z-axis direction) between the first electrode 51 and the boundary F1 is taken as a seventh distance d7. The seventh distance d7 is greater than the second distance d2. An appropriate switching operation is obtained thereby. In one example, the absolute value of the difference between the first distance d1 and the second distance d2 is not less than 0.1 times and not more than 10 times the absolute value of a difference z1 between the seventh distance d7 and the second distance d2. The concentration of the electric field can be more effectively suppressed by such a first distance d1.

An example of characteristics of the semiconductor device is described below.

According to the embodiment as shown in FIG. 2, the lower surface of the first conductive member 61 may be oblique. For example, the first conductive member 61 further includes a third end portion p3 and a third other-end portion q3. The third end portion p3 is between the first electrode 51 and the third other-end portion q3 in the first direction (the Z-axis direction). The position in the second direction (the X-axis direction) of the third end portion p3 is between the position in the second direction of the portion 11a of the first semiconductor region 11 and the position in the second direction of the first end portion p1. The third end portion p3 is the lower end portion of the first conductive member 61 at the end of the first conductive member 61 at the first semiconductor region 11 portion 11a side. The distance along the first direction (the Z-axis direction) between the first electrode 51 and the third end portion p3 is taken as a third distance d3. The third distance d3 is greater than the first distance d1. For example, the first conductive member 61 includes a side surface 61sf that includes the first and third end portions p1 and p3. The side surface 61sf is oblique to the first direction. For example, the concentration of the electric field can be more effectively suppressed by such a shape.

For example, the third distance d3 may be substantially equal to the second distance d2. For example, the absolute value of the difference between the third distance d3 and the second distance d2 is less than the absolute value of the difference between the first distance d1 and the second distance d2. The third distance d3 may be less than the second distance d2.

On the other hand, the lower end portion of the third electrode 53 may be substantially along the X-Y plane. For example, the third electrode 53 includes a fourth end portion p4 and a fourth other-end portion q4. The fourth end portion p4 is between the first electrode 51 and the fourth other-end portion q4 in the first direction (the Z-axis direction). The position in the second direction (the X-axis direction) of the second end portion p2 is between the position in the second direction of the fourth end portion p4 and the position in the second direction of the portion 11a of the first semiconductor region 11. The distance along the first direction (the Z-axis direction) between the first electrode 51 and the fourth end portion p4 is taken as a fourth distance d4. The absolute value of the difference between the fourth distance d4 and the second distance d2 is less than the absolute value of the difference between the first distance d1 and the third distance d3. Thus, for example, the concentration of the electric field can be effectively suppressed by setting the position of the lower end portion of the first conductive member 61 at the end portion of the first conductive member 61 distant to the portion 11a of the first semiconductor region 11 to be low.

As shown in FIG. 1, the semiconductor device 110 may further include a second conductive member 62. The position in the second direction (the X-axis direction) of the first conductive member 61 is between the position in the second direction of the portion 11a of the first semiconductor region 11 and the position in the second direction of the second conductive member 62. The second conductive member 62 is electrically connected with the second electrode 52. Or, the second conductive member 62 is electrically connectable with the second electrode 52. For example, the second conductive member 62 may be electrically connected with the connection member 61C by a connection member 62C. The second conductive member 62 may be electrically connected with the second electrode 52 by the interconnect 52LL, etc. For example, the second conductive member 62 functions as a field plate. The concentration of the electric field can be further suppressed by providing the second conductive member 62.

As shown in FIG. 2, the second conductive member 62 includes a fifth end portion p5 and a fifth other-end portion q5. The fifth end portion p5 is between the first electrode 51 and the fifth other-end portion q5 in the first direction (the Z-axis direction). The fifth end portion p5 corresponds to the lower end portion of the second conductive member 62. The distance along the first direction (the Z-axis direction) between the first electrode 51 and the fifth end portion p5 is taken as a fifth distance d5. The fifth distance d5 is less than the first distance d1. A portion 41q of the first insulating member 41 is between the semiconductor member 10 and the second conductive member 62 and between the first conductive member 61 and the second conductive member 62.

As shown in FIG. 1, the semiconductor device 110 may further include a third conductive member 63. The position in the second direction (the X-axis direction) of the third electrode 53 is between the position in the second direction of the third conductive member 63 and the position in the second direction of the portion 11a of the first semiconductor region 11. The third conductive member 63 is electrically connected with the second electrode 52. Or, the third conductive member 63 is electrically connectable with the second electrode 52. For example, the third conductive member 63 may be electrically connected with the connection member 61C by a connection member 63C. The third conductive member 63 may be electrically connected with the second electrode 52 by the interconnect 52LL, etc. For example, the third conductive member 63 functions as a field plate. The concentration of the electric field can be further suppressed by providing the third conductive member 63.

As shown in FIG. 2, the third conductive member 63 includes a sixth end portion p6 and a sixth other-end portion q6. The sixth end portion p6 is between the first electrode 51 and the sixth other-end portion q6 in the first direction (the Z-axis direction). The sixth end portion p6 corresponds to the lower end portion of the third conductive member 63. The distance along the first direction (the Z-axis direction) between the first electrode 51 and the sixth end portion p6 is taken as a sixth distance d6. The sixth distance d6 is less than the first distance d1. A portion 41p of the first insulating member 41 is between the semiconductor member 10 and the third conductive member 63. In the example, the portion 41p of the first insulating member 41 is between the third electrode 53 and the third conductive member 63.

As shown in FIG. 1, the semiconductor device 110 may further include a first counter conductive member 61A. The position in the second direction (the X-axis direction) of the second conductive member 62 is between the position in the second direction of the first conductive member 61 and the position in the second direction of the first counter conductive member 61A. The first counter conductive member 61A is electrically connected with the second electrode 52. Or, the first counter conductive member 61A is electrically connectable with the second electrode 52. For example, the first counter conductive member 61A may be electrically connected with the connection member 61C by a connection member 61AC. The first counter conductive member 61A may be electrically connected with the second electrode 52 by the interconnect 52LL, etc. For example, the first counter conductive member 61A functions as a field plate. The concentration of the electric field can be further suppressed by providing the first counter conductive member 61A.

As shown in FIG. 1, the portion 41q of the first insulating member 41 is between the semiconductor member 10 and the first counter conductive member 61A and between the second conductive member 62 and the first counter conductive member 61A.

As shown in FIG. 1, the semiconductor device 110 may further include a third counter electrode 53A. The position in the second direction (the X-axis direction) of the third conductive member 63 is between the position in the second direction of the third counter electrode 53A and the position in the second direction of the third electrode 53. The third counter electrode 53A is electrically connected with the third electrode 53. For example, the electrical connection is performed by a connection member 53AC. The third counter electrode 53A functions as another gate electrode.

An example of characteristics of the semiconductor device will now be described. An example of simulation results relating to the characteristics of the semiconductor device will now be described.

FIGS. 3A to 3D are schematic cross-sectional views illustrating simulation models.

Figure 3A:
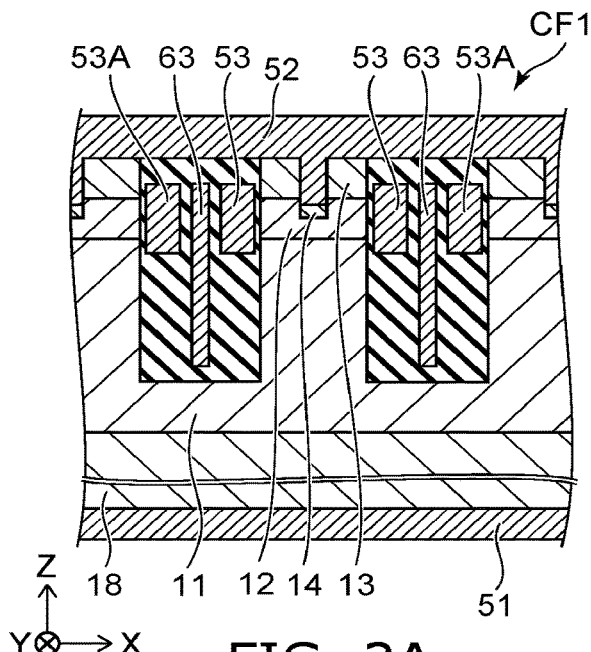
FIGS. 3A to 3D are schematic cross-sectional views illustrating simulation models.
Figure 3B:
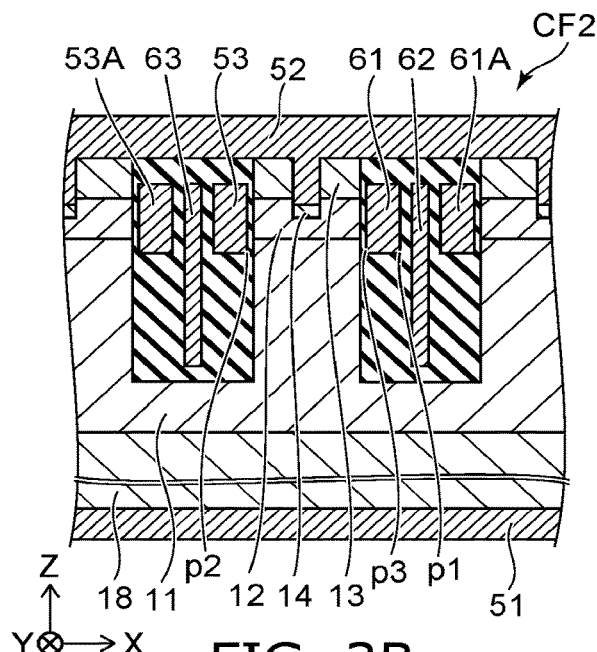
Figure 3C:
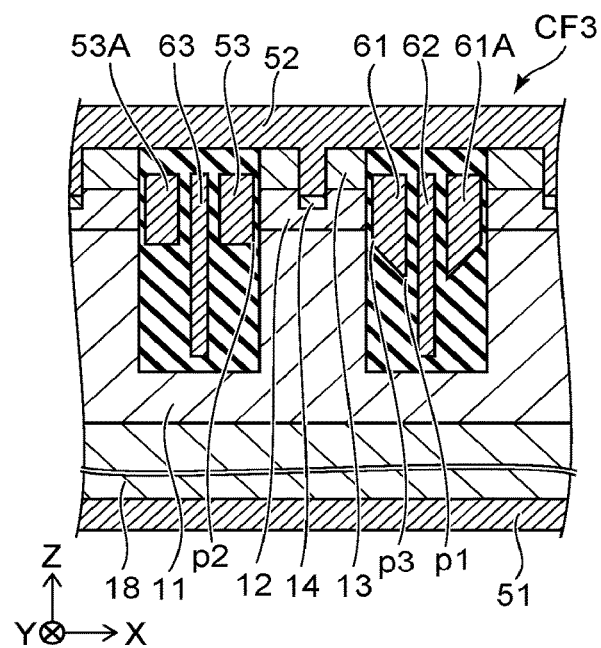
Figure 3D:
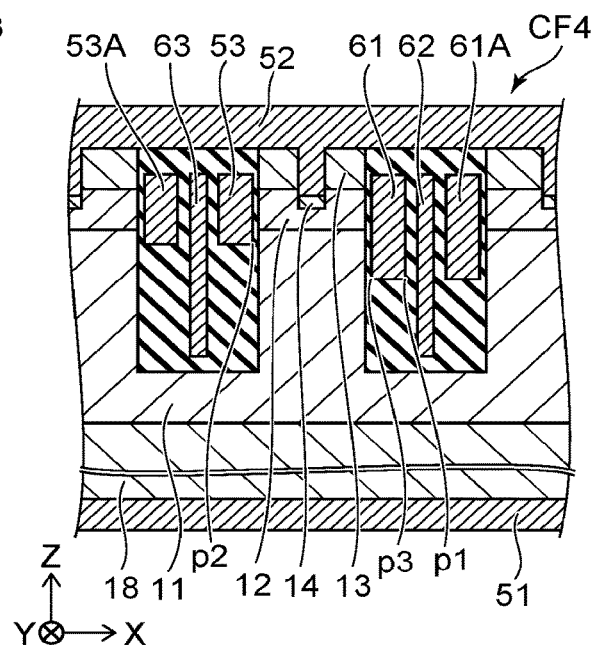

In a first configuration CF1 as shown in FIG. 3A, the third electrode 53, the third conductive member 63, and the third counter electrode 53A are located at positions of the first conductive member 61, the second conductive member 62, and the first counter conductive member 61A of the semiconductor device 110 illustrated in FIG. 1. As shown in FIGS. 3B to 3D, second to fourth configurations CF2 to CF4 include the first conductive member 61, the second conductive member 62, and the first counter conductive member 61A. In the second configuration CF2, the levels of the first and third end portions p1 and p3 are equal to the level of the second end portion p2. In the third configuration CF3, the level of the first end portion p1 is lower than the level of the second end portion p2; and the level of the third end portion p3 is equal to the level of the second end portion p2. In the fourth configuration CF4, the levels of both of the first and third end portions p1 and p3 are lower than the level of the second end portion p2. In the third and fourth configurations CF3 and CF4, the difference between the level of the first end portion p1 (the first distance d1 referring to FIG. 2) and the level of the second end portion p2 (the second distance d2 referring to FIG. 2) is 0.5 μm. In the example, the length z53 along the Z-axis direction of the third electrode 53 (referring to FIG. 2) is 0.986 μm. In the example, the difference z1 between the seventh distance d7 and the second distance d2 (referring to FIG. 2) is 0.115 μm.

It was found that the following characteristics were obtained by simulation for the first to fourth configurations CF1 to CF4. In the first configuration CF1, the parameter Ron•Qgd was 53.7 mΩ·nC, and the breakdown voltage was 109.0 V. In the second configuration CF2, the parameter Ron•Qgd was 34.3 mΩ·nC, and the breakdown voltage was 109.1 V. In the third configuration CF3, the parameter Ron•Qgd was 33.5 mΩ·nC, and the breakdown voltage was 109.0 V. In the fourth configuration CF4, the parameter Ron•Qgd was 29.3 mΩ·nC, and the breakdown voltage was 90.4 V.

Thus, the parameter Ron•Qgd is reduced by providing the first conductive member 61 instead of a portion of the third electrode 53. Comparing the second configuration CF2 and the third configuration CF3, the parameter Ron•Qgd can be smaller in the third configuration CF3. In the fourth configuration CF4, the parameter Ron•Qgd is reduced, but the breakdown voltage is reduced.

The embodiment includes the first conductive member 61 described above based on such results. Thereby, compared to the first configuration CF1 that includes only the third electrode 53, a small parameter Ron•Qgd can be obtained, and the loss can be suppressed.

According to the embodiment, it is favorable for the first end portion p1 to be lower than the third end portion p3 as in the third configuration CF3. A smaller parameter Ron•Qgd is obtained thereby. Also, a high breakdown voltage can be maintained.

RonA of the first to fourth configurations CF1 to CF4 was 34.40 mΩmm², 44.84 mΩmm², 44.84 mΩmm², and 44.81 mmΩmm². Thus, RonA in the second to fourth configurations CF2 to CF4 was greater than RonA in the first configuration CF1. It is considered that this is because the density of the channel is reduced by providing the first conductive member 61 instead of the third electrode 53. On the other hand, as described above, the parameter Ron•Qgd in the second to fourth configurations CF2 to CF4 was less than the parameter Ron•Qgd in the first configuration CF1. This is because "Qgd" greatly decreased in the second to fourth configurations CF2 to CF4.

Thus, according to the embodiment, "Qgd" can be reduced more than the amount of the increase of RonA. The loss can be suppressed thereby.

Figure 4:
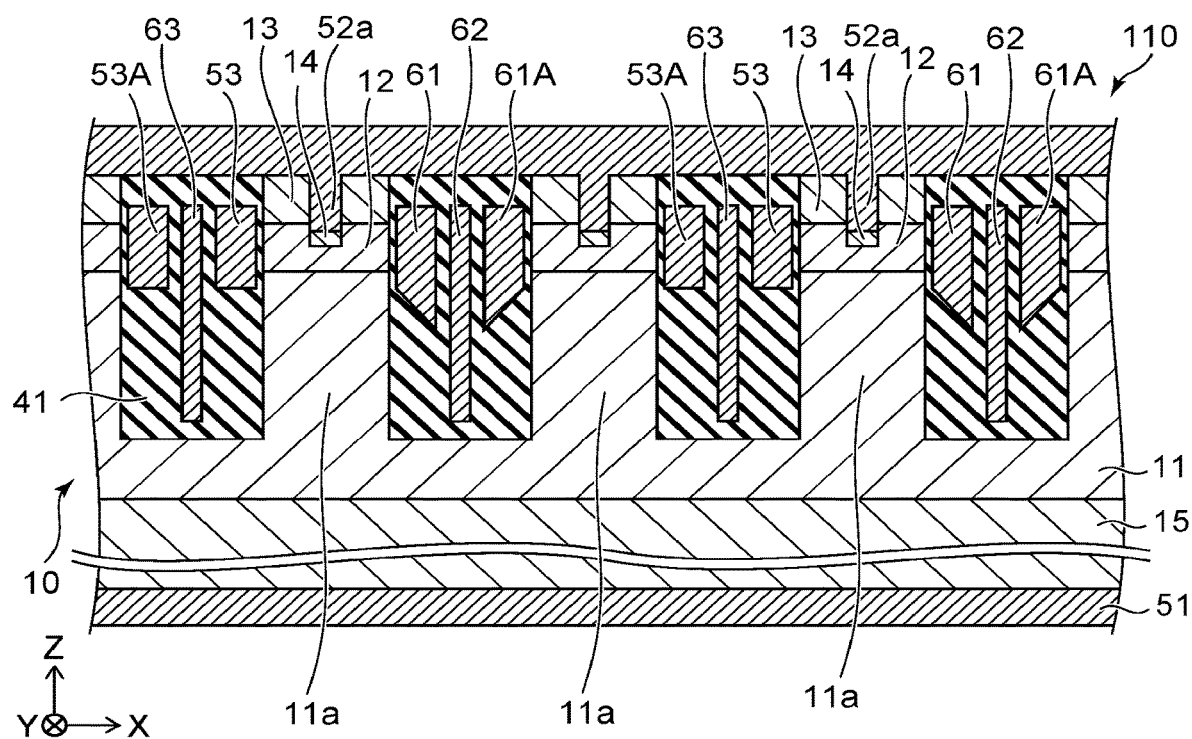
FIG. 4 is a schematic cross-sectional view illustrating the semiconductor device according to the first embodiment.

FIG. 4 is a schematic cross-sectional view illustrating the semiconductor device according to the first embodiment.

In the semiconductor device 110 as shown in FIG. 4, the configuration illustrated in FIG. 1 may be repeated in the X-axis direction. For example, the first conductive member 61 is located between one of the multiple third electrodes 53 and another one of the multiple third electrodes 53.

Second Embodiment

Figure 5:
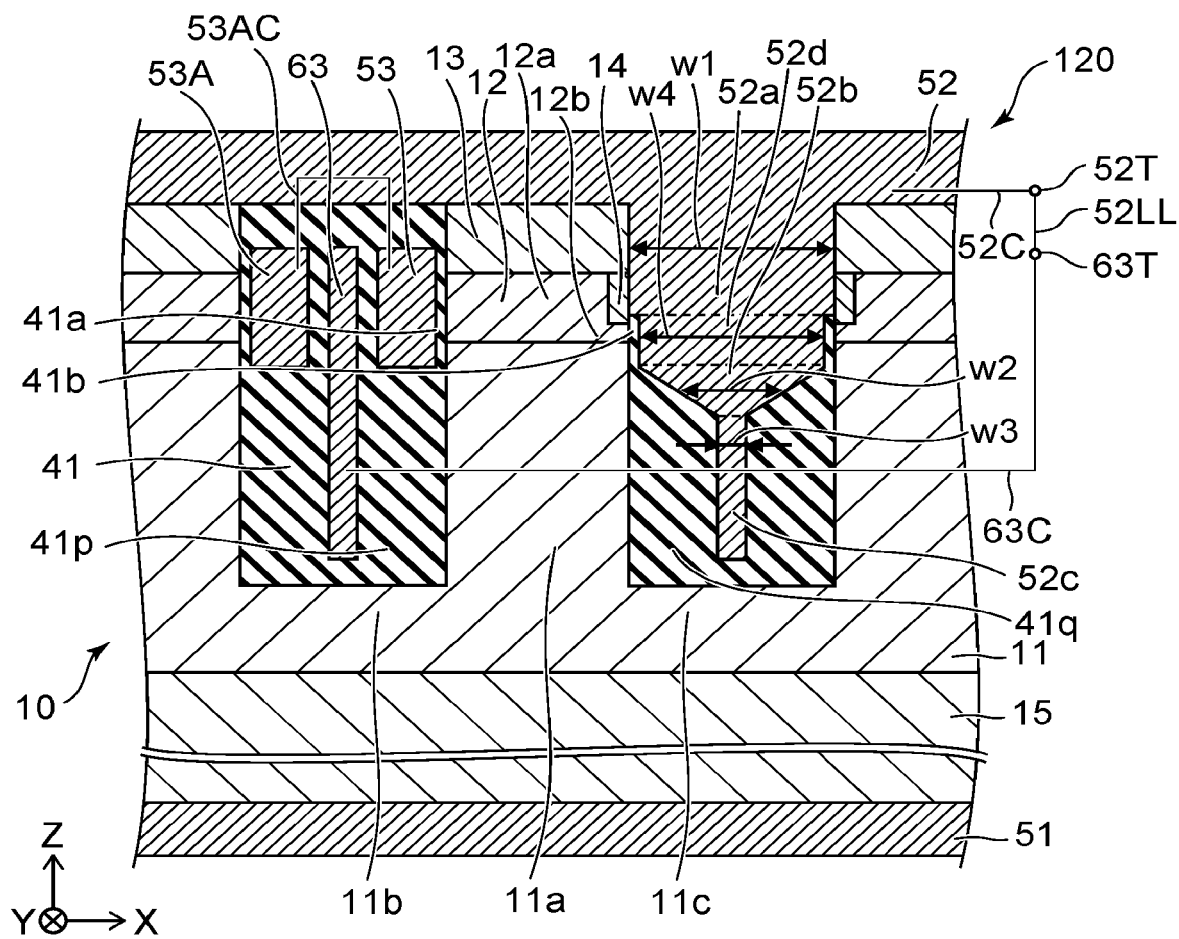
FIG. 5 is a schematic cross-sectional view illustrating a semiconductor device according to a second embodiment.
Figure 6:
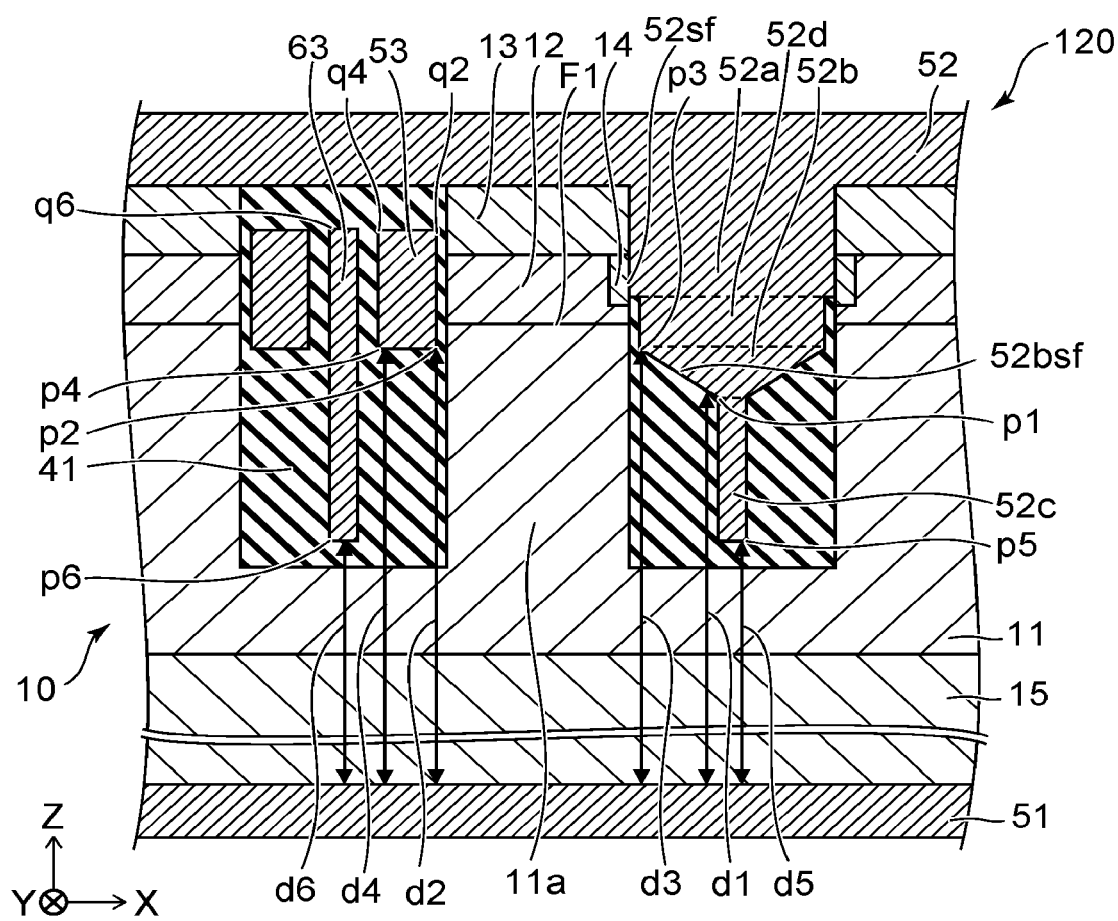
FIG. 6 is a schematic cross-sectional view illustrating the semiconductor device according to the second embodiment.

FIGS. 5 and 6 are schematic cross-sectional views illustrating a semiconductor device according to a second embodiment.

As shown in FIG. 5, the semiconductor device 120 according to the embodiment includes the first electrode 51, the second electrode 52, the third electrode 53, the semiconductor member 10, and the first insulating member 41.

The second electrode 52 includes the first conductive portion 52a, a second conductive portion 52b, and a third conductive portion 52c. The third conductive portion 52c is between the first electrode 51 and the first conductive portion 52a in the first direction (e.g., the Z-axis direction). The second conductive portion 52b is between the third conductive portion 52c and the first conductive portion 52a. For example, the third conductive portion 52c is on the first electrode 51. The second conductive portion 52b is on the third conductive portion 52c. The first conductive portion 52a is on the second conductive portion 52b.

The width (the length) along the second direction of the first conductive portion 52a is taken as a first width w1. The second direction crosses the first direction. The second direction is, for example, the X-axis direction. The width (the length) along the second direction of the second conductive portion 52b is taken as a second width w2. The width (the length) along the second direction of the third conductive portion 52c is taken as a third width w3. The third width w3 is less than the first width w1. The second width w2 is between the first width w1 and the third width w3. The second width w2 decreases in the orientation from the first conductive portion 52a toward the third conductive portion 52c. The region in which the width decreases corresponds to the second conductive portion 52b. For example, the width of the first conductive portion 52a is substantially constant. The width of the third conductive portion 52c is substantially constant.

The second electrode 52 may further include a fourth conductive portion 52d. The fourth conductive portion 52d is between the second conductive portion 52b and the first conductive portion 52a in the first direction (the Z-axis direction). The width (the length) along the second direction of the fourth conductive portion 52d is taken as a fourth width w4. For example, the fourth width w4 is substantially equal to the maximum value of the second width w2. The fourth width w4 is less than the first width w1.

The semiconductor member 10 includes the first semiconductor region 11 of the first conductivity type (e.g., the n-type), the second semiconductor region 12 of the second conductivity type (e.g., the p-type), the third semiconductor region 13 of the first conductivity type, and the fourth semiconductor region 14 of the second conductivity type. The second semiconductor region 12 is between the third semiconductor region 13 and the portion 11a of the first semiconductor region 11 in the first direction (the Z-axis direction). The second semiconductor region 12 is between the third electrode 53 and the first conductive portion 52a in the second direction (e.g., the X-axis direction). The fourth semiconductor region 14 is between the second semiconductor region 12 and the first conductive portion 52a in the second direction. The second-conductivity-type impurity concentration in the fourth semiconductor region 14 is greater than the second-conductivity-type impurity concentration in the second semiconductor region 12. The second semiconductor region 12 is, for example, a p-region. The fourth semiconductor region 14 is, for example, a p$^+$-region.

For example, a portion of the third semiconductor region 13 is between the third electrode 53 and the first conductive portion 52a in the second direction (e.g., the X-axis direction). A portion of the second semiconductor region 12 is between the third electrode 53 and the first conductive portion 52a in the second direction (e.g., the X-axis direction). Another portion of the second semiconductor region 12 is between the third electrode 53 and the fourth conductive portion 52d in the second direction (e.g., the X-axis direction).

The first conductive portion 52a is electrically connected with the fourth and third semiconductor regions 14 and 13. The first-conductivity-type impurity concentration in the third semiconductor region 13 is greater than the first-conductivity-type impurity concentration in the first semiconductor region 11. The third semiconductor region 13 is, for example, an n$^+$-region.

The first electrode 51 is electrically connected with the first semiconductor region 11. For example, the semiconductor device 120 may include the fifth semiconductor region 15 that is located between the first electrode 51 and the first semiconductor region 11. The fifth semiconductor region 15 is of the first conductivity type. The first-conductivity-type impurity concentration in the fifth semiconductor region 15 is greater than the first-conductivity-type impurity concentration in the first semiconductor region 11. The first semiconductor region 11 is, for example, an n-region or an n$^-$-region. The fifth semiconductor region 15 is, for example, an n$^+$-region.

At least a portion of the first insulating member 41 is between the semiconductor member 10 and the third electrode 53, between the semiconductor member 10 and the second conductive portion 52b, and between the semiconductor member 10 and the third conductive portion 52c. For example, at least a portion of the first insulating member 41 is between the semiconductor member 10 and the fourth conductive portion 52d. For example, the first insulating region 41a is between the third electrode 53 and the third semiconductor region 13 and between the third electrode 53 and the second semiconductor region 12. For example, the second insulating region 41b is between the second semiconductor region 12 and the fourth conductive portion 52d.

As shown in FIG. 6, the second conductive portion 52b includes the first end portion p1. The first end portion p1 is connected with the third conductive portion 52c. The first end portion p1 is the end of the second conductive portion 52b at the first electrode 51 side. The first end portion p1 corresponds to the lower end of the second conductive portion 52b. The first end portion p1 substantially contacts the upper end of the third conductive portion 52c.

As shown in FIG. 6, the third electrode 53 includes the second end portion p2 and the second other-end portion q2. The second end portion p2 is between the first electrode 51 and the second other-end portion q2 in the first direction (the Z-axis direction).

The distance along the first direction (the Z-axis direction) between the first electrode 51 and the first end portion p1 is taken as the first distance d1. The distance along the first direction between the first electrode 51 and the second end portion p2 is taken as the second distance d2. The first distance d1 is less than the second distance d2.

In the semiconductor device 120 that has such a configuration as well, the parameter Ron•Qgd can be reduced by providing the first to third conductive portions 52a to 52c of the second electrode 52 next to the third electrode 53. For example, the loss can be suppressed. For example, the concentration of the electric field can be suppressed by providing the second conductive portion 52b of which the width decreases along the orientation toward the first electrode 51. For example, a high breakdown voltage is obtained. For example, it is easier to reduce the width in the X-axis direction of the portion 11a of the first semiconductor region 11 by providing the fourth semiconductor region 14 at a side surface 52sf of the first conductive portion 52a (referring to FIG. 6).

As shown in FIG. 6, the second conductive portion 52b includes a third end portion p3 at the first conductive portion 52a side. The third end portion p3 is the upper end of the second conductive portion 52b. The position of the third end portion p3 in the second direction (the X-axis direction) is between the position of the portion 11a of the first semiconductor region 11 in the second direction and the position of the first end portion p1 in the second direction. The distance along the first direction (the Z-axis direction) between the first electrode 51 and the third end portion p3 is taken as the third distance d3. The third distance d3 is greater than the first distance d1. For example, a side surface 52bsf of the second conductive portion 52b is oblique to the first direction. The concentration of the electric field can be suppressed.

As shown in FIG. 6, the semiconductor member 10 includes the boundary F1 between the second semiconductor region 12 and the portion 11a of the first semiconductor region 11. The boundary F1 is between the third electrode 53 and the fourth conductive portion 52d in the second direction (the X-axis direction). As described above, a portion (the second insulating region 41b) of the first insulating member 41 is between the boundary F1 and the fourth conductive portion 52d.

As shown in FIG. 6, the third electrode 53 includes the fourth end portion p4 and the fourth other-end portion q4. The fourth end portion p4 is between the first electrode 51 and the fourth other-end portion q4 in the first direction (the Z-axis direction). The position in the second direction (the X-axis direction) of the second end portion p2 is between the position in the second direction of the fourth end portion p4 and the position in the second direction of the portion 11a of the first semiconductor region 11. The distance along the first direction (the Z-axis direction) between the first electrode 51 and the fourth end portion p4 is taken as the fourth distance d4. The absolute value of the difference between the fourth distance d4 and the second distance d2 is less than the absolute value of the difference between the first distance d1 and the third distance d3. For example, the fourth distance d4 may be substantially equal to the second distance d2.

As shown in FIG. 6, the third conductive portion 52c includes the fifth end portion p5. The fifth end portion p5 is between the first electrode 51 and the first end portion p1 in the first direction (the Z-axis direction). The fifth end portion p5 is, for example, the lower end portion of the third conductive portion 52c. The fifth end portion p5 is, for example, the lower end portion of the second electrode 52. The distance along the first direction (the Z-axis direction) between the first electrode 51 and the fifth end portion p5 is taken as the fifth distance d5. The fifth distance d5 is less than the first distance d1. The concentration of the electric field can be further suppressed by providing the third conductive portion 52c.

As shown in FIG. 5, the first semiconductor region 11 may include the partial region 11b and the partial region 11c. The direction from the partial region 11b toward the third electrode 53 is along the first direction. The direction from the partial region 11c toward the second conductive portion 52b is along the first direction.

As shown in FIG. 5, the semiconductor device 120 may further include the third conductive member 63. The position in the second direction (the X-axis direction) of the third electrode 53 is between the position in the second direction of the third conductive member 63 and the position in the second direction of the portion 11a of the first semiconductor region 11. The third conductive member 63 is electrically connected with the second electrode 52. Or, the third conductive member 63 is electrically connectable with the second electrode 52. For example, the third conductive member 63 may be electrically connected with the second electrode 52 by the connection member 63C, the interconnect 52LL, etc. For example, the terminal 63T that is electrically connected with the third conductive member 63 may be provided, and the terminal 52T that is electrically connected with the second electrode 52 may be provided. These terminals may be electrically connected to each other by the interconnect 52LL. These terminals may be included in the semiconductor device 120. The interconnect 52LL may be provided separately from the semiconductor device 120.

As shown in FIG. 6, the third conductive member 63 includes the sixth end portion p6 and the sixth other-end portion q6. The sixth end portion p6 is between the first electrode 51 and the sixth other-end portion q6 in the first direction (the Z-axis direction). The distance along the first direction (the Z-axis direction) between the first electrode 51 and the sixth end portion p6 is taken as the sixth distance d6. The sixth distance d6 is less than the first distance d1. For example, the concentration of the electric field can be suppressed by providing the third conductive member 63.

As shown in FIG. 5, the portion 41p of the first insulating member 41 is between the semiconductor member 10 and the third conductive member 63. The other portion 41q of the first insulating member 41 is between the semiconductor member 10 and the third conductive portion 52c.

As shown in FIG. 5, the semiconductor device 120 may further include the third counter electrode 53A. The position in the second direction (the X-axis direction) of the third conductive member 63 is between the position in the second direction of the third counter electrode 53A and the position in the second direction of the third electrode 53. The third counter electrode 53A is electrically connected with the third electrode 53. For example, the electrical connection is performed by the connection member 53AC. The third counter electrode 53A functions as another gate electrode.

Figure 7:
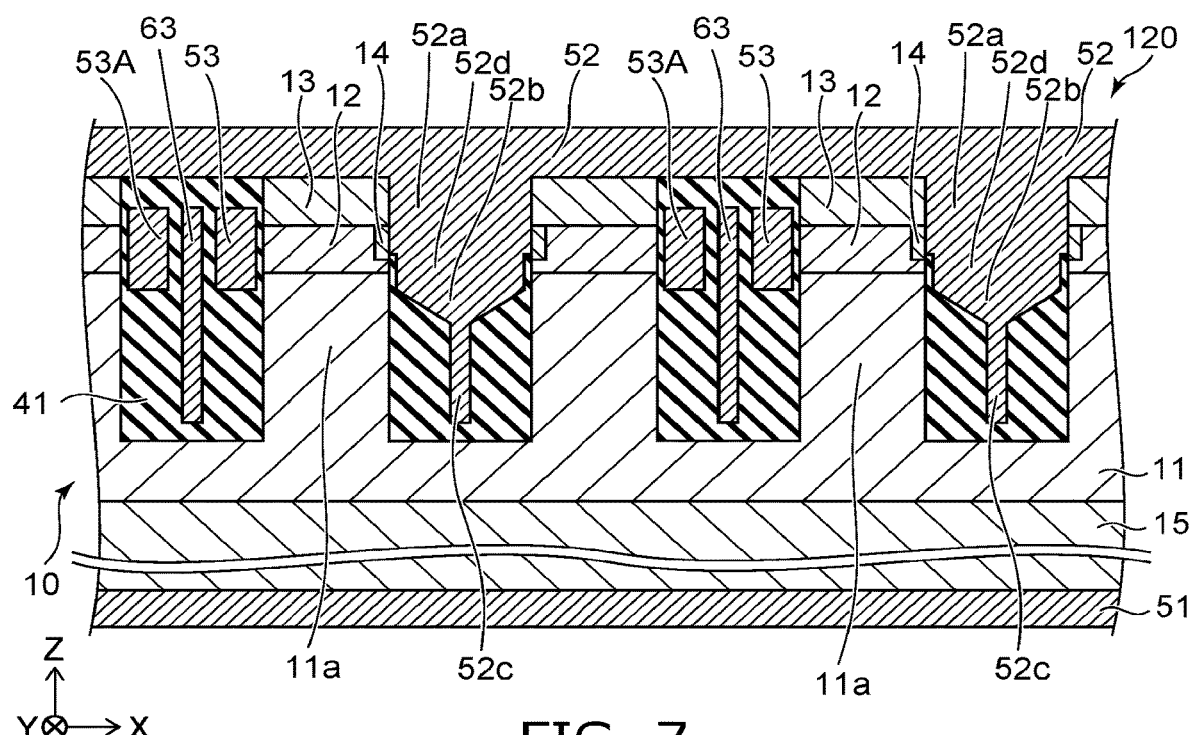
FIG. 7 is a schematic cross-sectional view illustrating the semiconductor device according to the second embodiment.

FIG. 7 is a schematic cross-sectional view illustrating the semiconductor device according to the second embodiment.

In the semiconductor device 120 as shown in FIG. 7, the configuration illustrated in FIG. 5 may be repeated in the X-axis direction. For example, the first to fourth conductive portions 52a to 52d are located between one of the multiple third electrodes 53 and another one of the multiple third electrodes 53.

An example of a method for manufacturing the semiconductor device according to the embodiment will now be described. An example of the method for manufacturing the semiconductor device 110 will now be described.

FIGS. 8A to 8C, FIGS. 9A to 9C, FIGS. 10A to 10C, FIGS. 11A to 11C, FIGS. 12A to 12C, FIGS. 13A to 13C, and FIGS. 14A to 14C are schematic cross-sectional views illustrating the method for manufacturing the semiconductor device according to the embodiment.

Figure 8A:
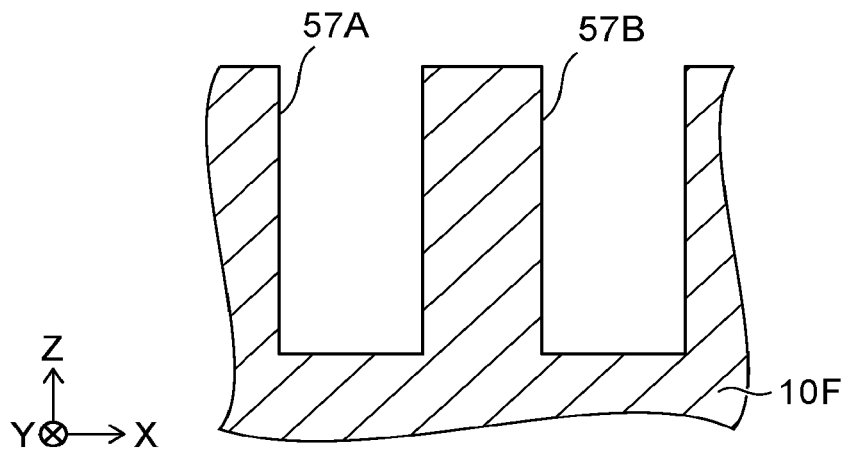
FIG. 8A to 8C are schematic cross-sectional views illustrating the method for manufacturing the semiconductor device according to the embodiment.

As shown in FIG. 8A, a first trench 57A and a second trench 57B are formed in a semiconductor layer 10F. The semiconductor layer 10F is used to form at least a portion of the semiconductor member 10. The semiconductor layer 10F is, for example, a semiconductor substrate (e.g., a silicon substrate). For example, the first trench 57A and the second trench 57B can be formed by RIE (Reactive Ion Etching). The first trench 57A corresponds to the region in which the third electrode 53 is formed. The second trench 57B corresponds to the region in which the first conductive member 61, etc., are formed. These trenches extend along the Z-axis direction and the Y-axis direction.

Figure 8B:
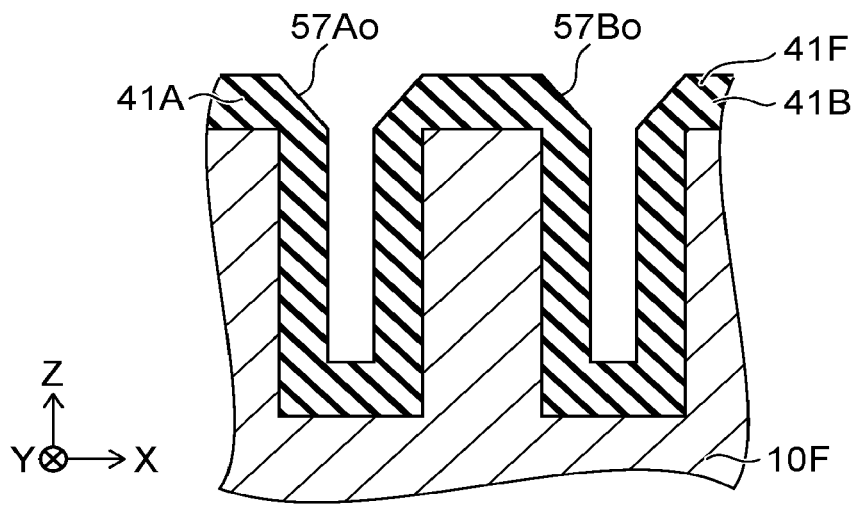

As shown in FIG. 8B, an insulating film 41F is formed on the semiconductor layer 10F. The insulating film 41F includes an insulating film 41A that corresponds to the first trench 57A, and an insulating film 41B that corresponds to the second trench 57B. For example, the insulating film 41F can be formed by thermal oxidation, CVD (Chemical Vapor Deposition), etc. For example, the surface of the opening of the insulating film 41A is oblique to the Z-axis direction. The surface of the opening of the insulating film 41B is oblique to the Z-axis direction.

Figure 8C:
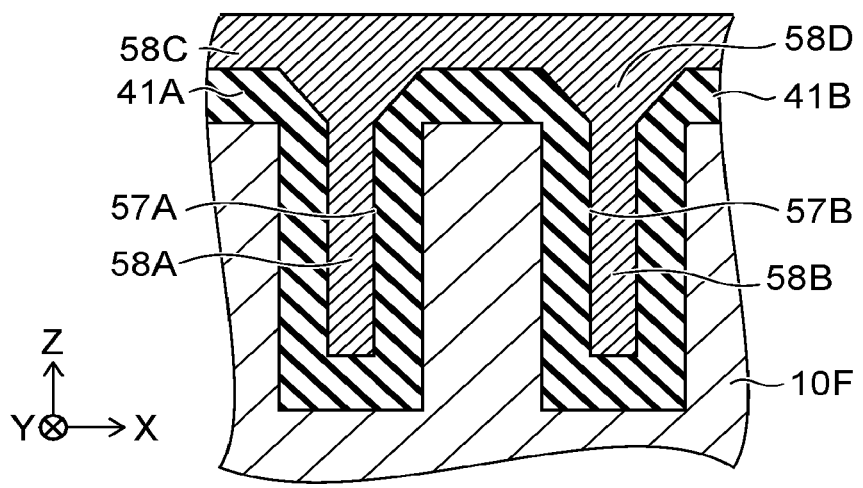

A conductive portion 58C is formed as shown in FIG. 8C. The conductive portion 58C is, for example, polysilicon. The conductive portion 58C is also formed in the first and second trenches 57A and 57B. A conductive member 58A is formed of the conductive portion 58C in the first trench 57A. A conductive member 58B is formed of the conductive portion 58C in the second trench 57B. At least a portion of the conductive member 58A is used to form at least a portion of the third conductive member 63. At least a portion of the conductive member 58B is used to form at least a portion of the second conductive member 62. The conductive portion 58C includes a conductive member 58D that is positioned on the conductive member 58B. The side surface of the conductive member 58D is oblique to the Z-axis direction.

Figure 9A:
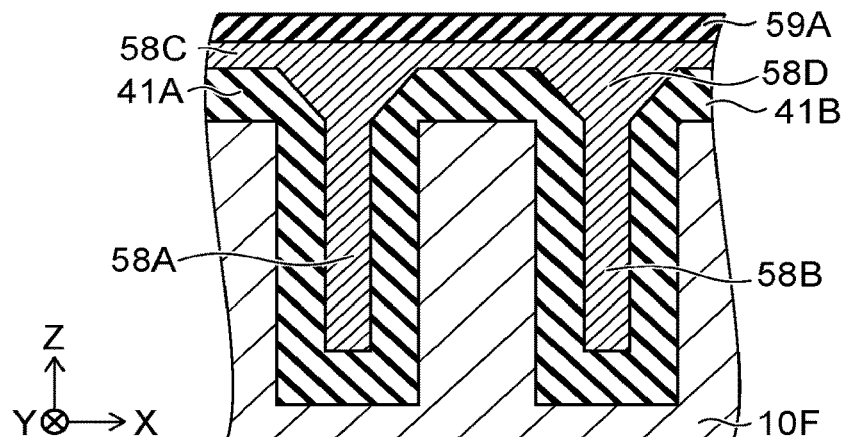
FIG. 9A to 9C are schematic cross-sectional views illustrating the method for manufacturing the semiconductor device according to the embodiment.

A mask material 59A is formed as shown in FIG. 9A. The mask material 59A is, for example, a silicon nitride film.

Figure 9B:
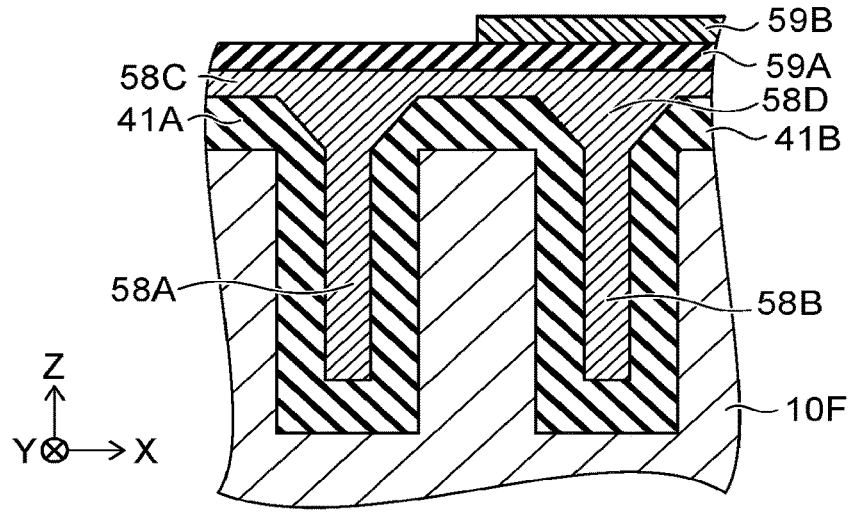

As shown in FIG. 9B, a mask material 59B is formed at the portion that corresponds to the conductive member 58B. The mask material 59B is, for example, a resist material. The mask material 59B is not formed at the portion that corresponds to the conductive member 58A.

Figure 9C:
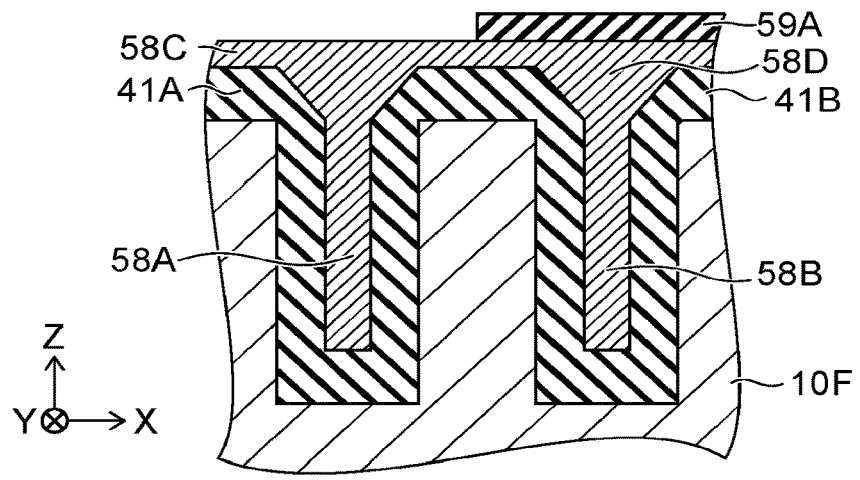

As shown in FIG. 9C, a portion of the mask material 59A is removed using the mask material 59B as a mask. Subsequently, the mask material 59B is removed. The mask material 59A is located at the portion that corresponds to the conductive member 58B, but is not located at the portion that corresponds to the conductive member 58A.

Figure 10A:
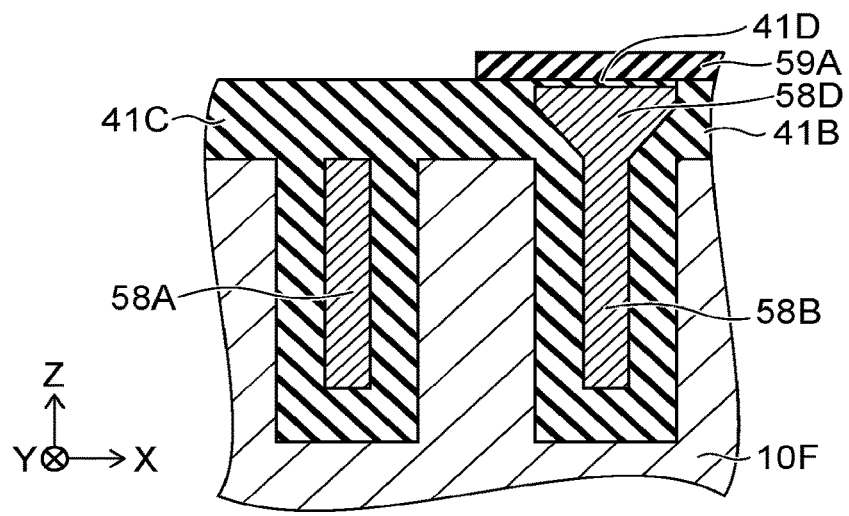
FIG. 10A to 10C are schematic cross-sectional views illustrating the method for manufacturing the semiconductor device according to the embodiment.

As shown in FIG. 10A, a portion of the conductive portion 58C is oxidized using the mask material 59A as a mask. Thereby, an insulating film 41C is formed in the region that corresponds to the conductive member 58A. An insulating film 41D is formed in the region that corresponds to the conductive member 58D. The oxidization includes, for example, thermal oxidation.

Figure 10B:
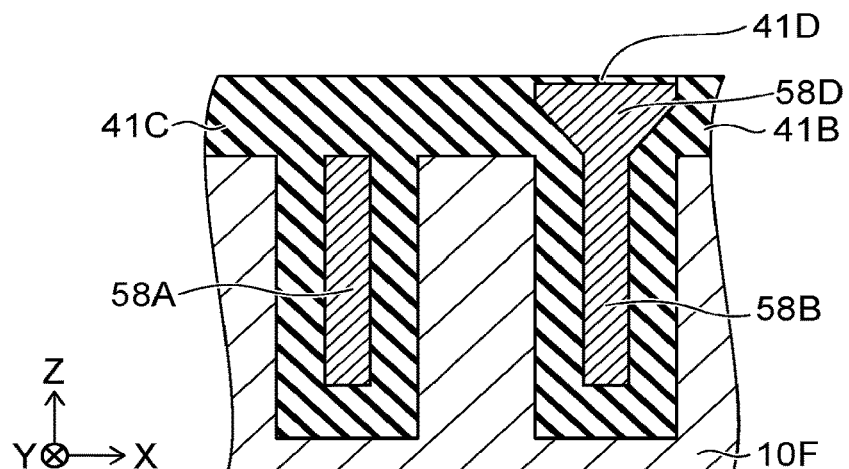

The mask material 59A (e.g., the silicon nitride film) is removed as shown in FIG. 10B. For example, the removal can be performed by RIE.

Figure 10C:
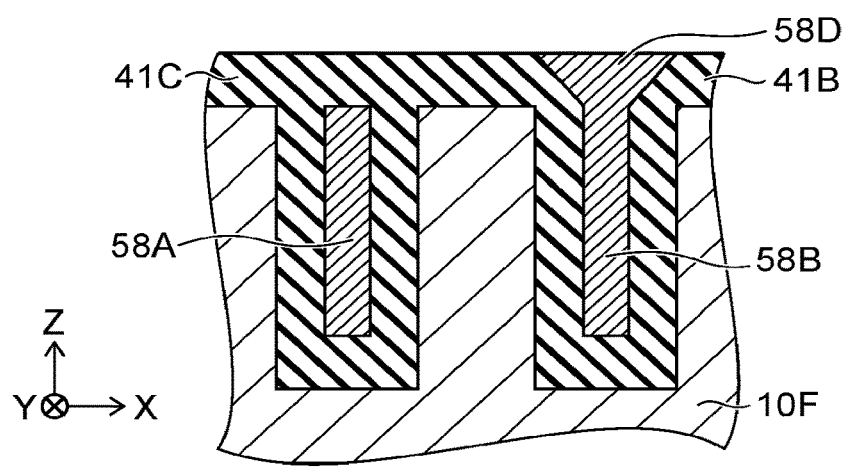

The insulating film 41D is removed as shown in FIG. 10C. The conductive member 58D is exposed.

Figure 11A:
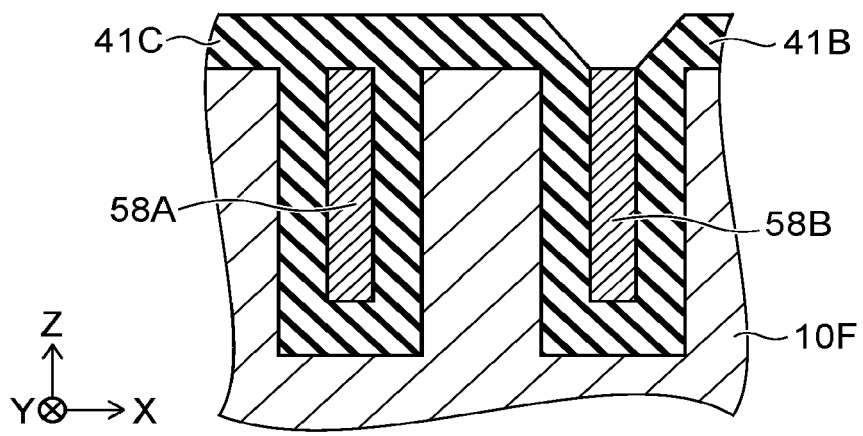
FIG. 11A to 11C are schematic cross-sectional views illustrating the method for manufacturing the semiconductor device according to the embodiment.

The conductive member 58D (e.g., polysilicon) is removed as shown in FIG. 11A. For example, the removal can be performed by CDE (Chemical Dry Etching).

Figure 11B:
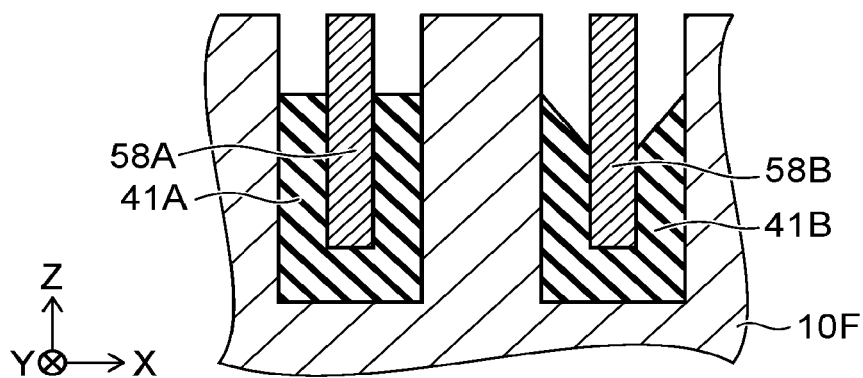

As shown in FIG. 11B, the insulating film 41C is removed, and a portion of the insulating film 41A and a portion of the insulating film 41B are removed. For example, the removal can be performed by RIE. A portion of the conductive member 58A and a portion of the conductive member 58B are exposed. At this time, a portion of the semiconductor layer 10F also is exposed.

Figure 11C:
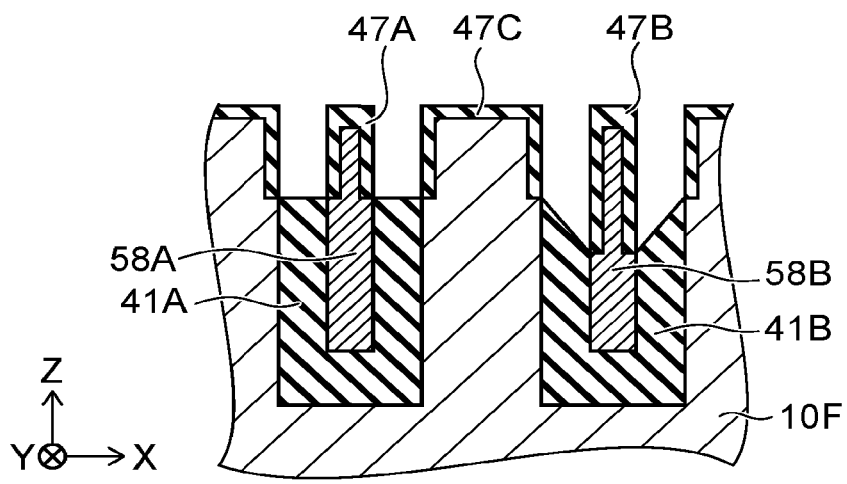

As shown in FIG. 11C, an insulating film 47A is formed at the surface portion of the exposed portion of the conductive member 58A; and an insulating film 47B is formed at the surface portion of the exposed portion of the conductive member 58B. An insulating film 47C is formed at the surface portion of the exposed portion of the semiconductor layer 10F. For example, these insulating films are formed by thermal oxidation.

Figure 12A:
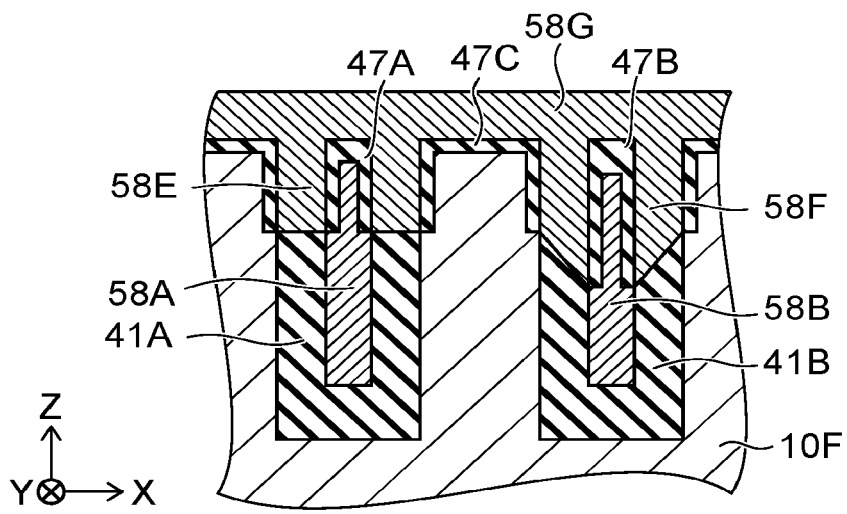
FIG. 12A to 12C are schematic cross-sectional views illustrating the method for manufacturing the semiconductor device according to the embodiment.

As shown in FIG. 12A, conductive members (a conductive member 58E, a conductive member 58F, and a conductive member 58G) are formed. The conductive member 58E is continuous with the conductive member 58A. The conductive member 58F is continuous with the conductive member 58B. The conductive member 58G is positioned on the conductive members 58E and 58F. The conductive member 58E, the conductive member 58F, and the conductive member 58G are, for example, polysilicon.

Figure 12B:
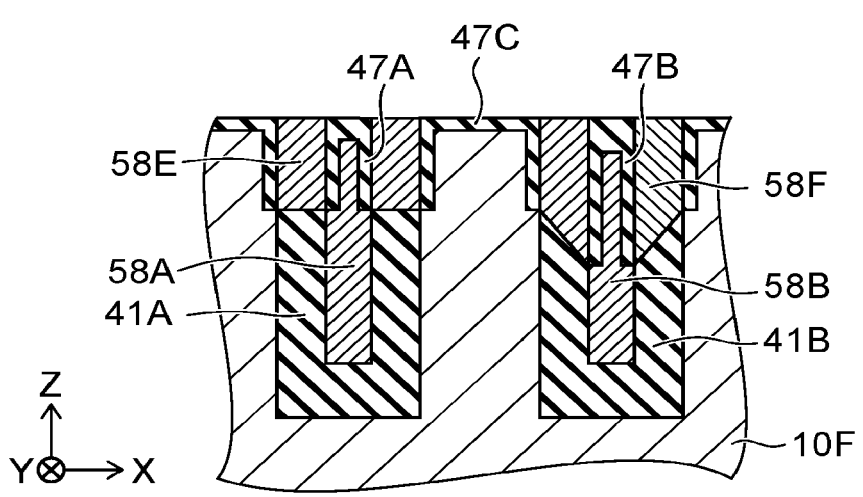

The conductive member 58G is removed as shown in FIG. 12B. For example, the removal is performed by CDE. The conductive member 58E and the conductive member 58F are exposed.

Figure 12C:
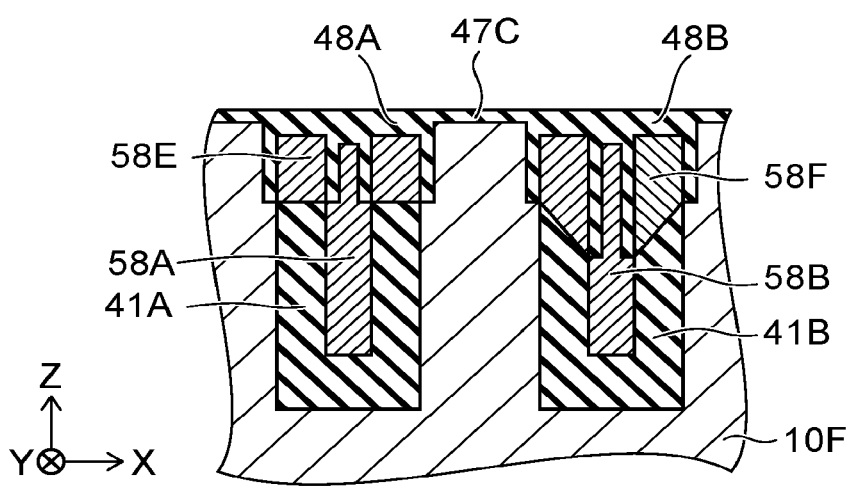

An insulating film 48A and an insulating film 48B are formed as shown in FIG. 12C. For example, the insulating film 48A can be formed by thermal oxidation of a portion of the conductive member 58E. For example, the insulating film 48B can be formed by thermal oxidation of a portion of the conductive member 58F.

Figure 13A:
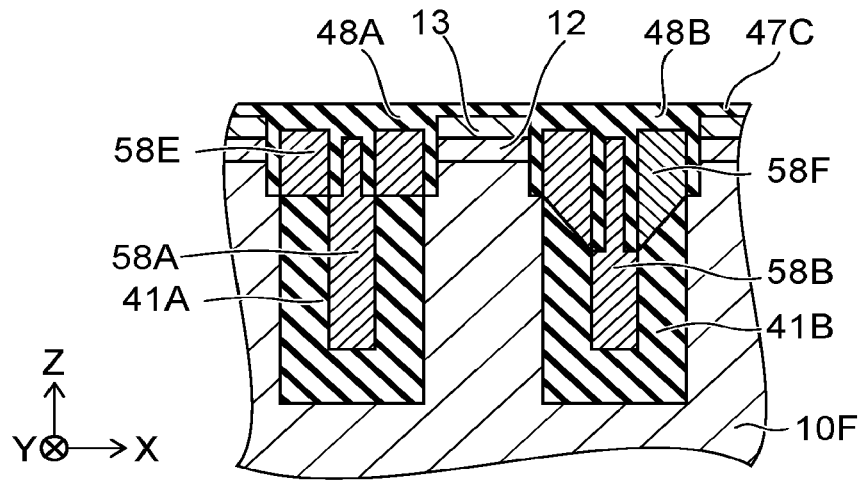
FIG. 13A to 13C are schematic cross-sectional views illustrating the method for manufacturing the semiconductor device according to the embodiment.

As shown in FIG. 13A, the second semiconductor region 12 is formed by introducing a second-conductivity-type impurity into a portion of the semiconductor layer 10F; and the third semiconductor region 13 is formed by introducing a first-conductivity-type impurity into a portion of the semiconductor layer 10F.

Figure 13B:
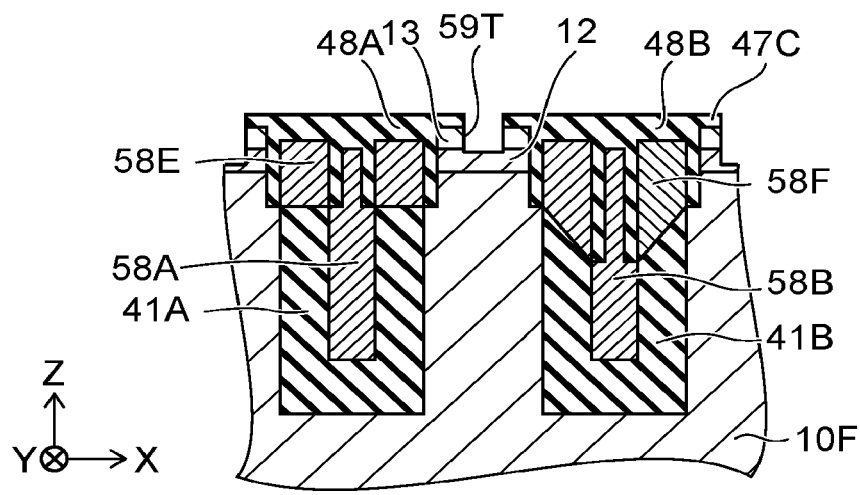

As shown in FIG. 13B, a trench 59T is formed by removing a portion of the third semiconductor region 13 and a portion of the second semiconductor region 12. The bottom surface of the trench 59T is in the second semiconductor region 12.

Figure 13C:
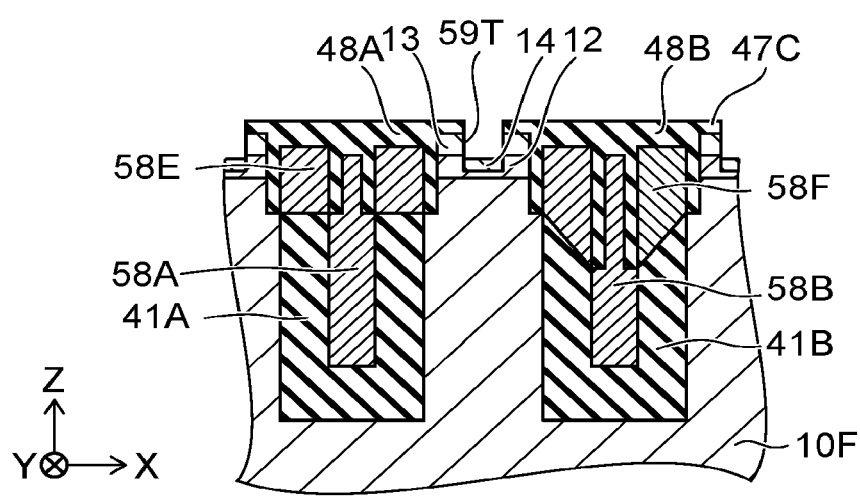

As shown in FIG. 13C, the fourth semiconductor region 14 is formed by introducing a second-conductivity-type impurity.

Figure 14A:
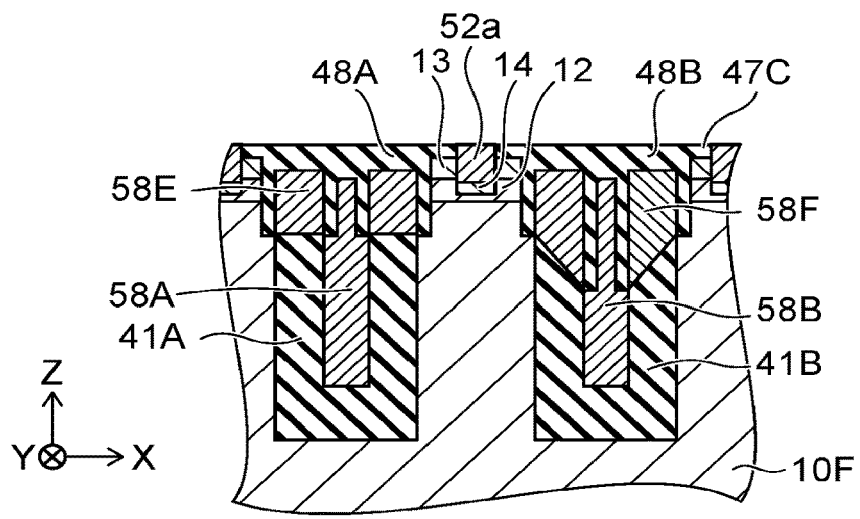
FIG. 14A to 14C are schematic cross-sectional views illustrating the method for manufacturing the semiconductor device according to the embodiment.

As shown in FIG. 14A, the first conductive portion 52a of the second electrode 52 is formed by filling a conductive member into the trench 59T. The conductive member that is filled into the trench 59T is, for example, tungsten, etc.

Figure 14B:
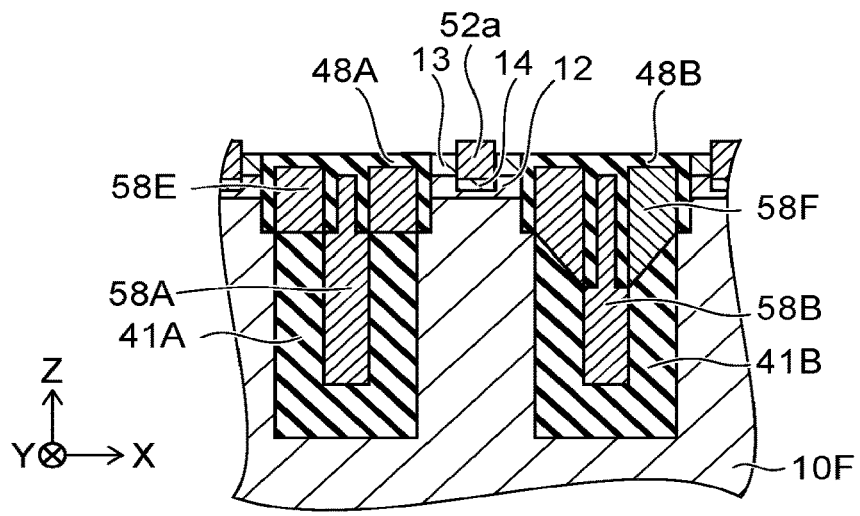

The insulating film 47C is removed as shown in FIG. 14B.

Figure 14C:
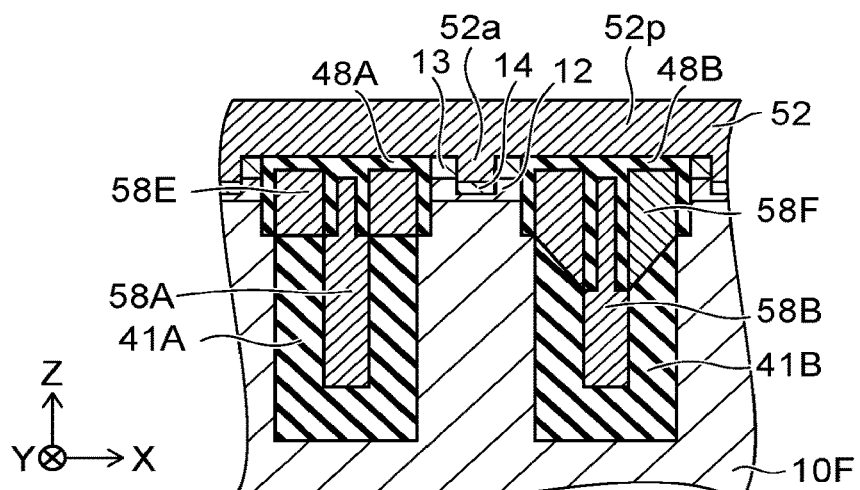

As shown in FIG. 14C, the conductive portion 52p of the second electrode 52 is formed by forming a conductive film. The conductive portion 52p is electrically connected with the first conductive portion 52a and the third semiconductor region 13. The conductive portion 52p includes, for example, aluminum, etc.

Subsequently, the semiconductor device 110 can be formed by forming the first electrode 51. At this time, the fifth semiconductor region 15 is formed as necessary.

For example, the shapes of the first to fourth conductive portions 52a to 52d of the semiconductor device 120 are obtained by patterning the shape of the conductive member 58B in the process of FIG. 11A and by performing the process of FIG. 12A (the formation of the conductive member). The fourth semiconductor region 14 of the semiconductor device 120 can be formed by modifying the position of the fourth semiconductor region 14 in the process described with reference to FIGS. 13A and 13B.

In embodiments described above, the semiconductor member may include, for example, at least one selected from the group consisting of silicon, silicon carbide (SiC), and gallium nitride (GaN). The first electrode 51 may include, for example, at least one selected from the group consisting of aluminum, titanium, nickel, and gold. The first conductive portion 52a of the second electrode 52 may include, for example, at least one selected from the group consisting of tungsten and polysilicon. The conductive portion 52p of the second electrode 52 may include, for example, at least one selected from the group consisting of aluminum, titanium, nickel, and gold. The third electrode 53 may include, for example, polysilicon, etc. The first to third conductive members 61 to 63 may include, for example, polysilicon, etc. The first insulating member 41 may include, for example, at least one selected from the group consisting of silicon oxide, silicon nitride, and silicon oxynitride.

According to embodiments, a semiconductor device can be provided in which the loss can be reduced.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode including a first conductive portion, a direction from the first electrode toward the first conductive portion being along a first direction;
a third electrode;
a first conductive member, a second direction from the third electrode toward the first conductive member crossing the first direction, a position in the second direction of the first conductive portion being between a position in the second direction of the third electrode and a position in the second direction of the first conductive member, the first conductive member being electrically connected with the second electrode or being electrically connectable with the second electrode;
a semiconductor member, the semiconductor member including a first semiconductor region of a first conductivity type, a second semiconductor region of a second conductivity type, and a third semiconductor region of the first conductivity type, the second semiconductor region in the first direction being between the third semiconductor region and a portion of the first semiconductor region, the second semiconductor region being in the second direction between the third electrode and the first conductive member, the first conductive portion being electrically connected with the second and third semiconductor regions, the first electrode being electrically connected with the first semiconductor region; and
a first insulating member, at least a portion of the first insulating member being between the semiconductor member and the third electrode and between the semiconductor member and the first conductive member,
the first conductive member including a first end portion and a first other-end portion,
the first end portion being in the first direction between the first electrode and the first other-end portion,
the third electrode including a second end portion and a second other-end portion,
the second end portion being in the first direction between the first electrode and the second other-end portion,
a first distance along the first direction between the first electrode and the first end portion being less than a second distance along the first direction between the first electrode and the second end portion,
wherein
the first conductive member further includes a third end portion and a third other-end portion,
the third end portion is in the first direction between the first electrode and the third other-end portion,
a position in the second direction of the third end portion is between a position in the second direction of the portion of the first semiconductor region and a position in the second direction of the first end portion in plan view, and
a third distance along the first direction between the first electrode and the third end portion is greater than the first distance,
the third electrode includes a fourth end portion and a fourth other-end portion,
the fourth end portion is in the first direction between the first electrode and the fourth other-end portion,
a position in the second direction of the second end portion is between a position in the second direction of the fourth end portion and a position in the second direction of the portion of the first semiconductor region,
an absolute value of a difference between the second distance and a fourth distance is less than an absolute value of a difference between the first distance and the third distance, and
the fourth distance is along the first direction between the first electrode and the fourth end portion.

2. The semiconductor device according to claim 1, wherein
the first conductive member includes a side surface including the first and third end portions, and
the side surface is oblique to the first direction.

3. The semiconductor device according to claim 1, further comprising:
a second conductive member,
a position in the second direction of the first conductive member being between a position in the second direction of the portion of the first semiconductor region and a position in the second direction of the second conductive member,
the second conductive member being electrically connected with the second electrode or being electrically connectable with the second electrode,
the second conductive member including a fifth end portion and a fifth other-end portion,
the fifth end portion being between the first electrode and the fifth other-end portion in the first direction,
a fifth distance along the first direction between the first electrode and the fifth end portion being less than the first distance,
a portion of the first insulating member being between the semiconductor member and the second conductive member and between the first conductive member and the second conductive member.

4. The semiconductor device according to claim 3, further comprising:
a first counter conductive member,
the position in the second direction of the second conductive member being between the position in the second direction of the first conductive member and a position in the second direction of the first counter conductive member,
the first counter conductive member being electrically connected with the second electrode or being electrically connectable with the second electrode,
a portion of the first insulating member being between the semiconductor member and the first counter conductive member and between the second conductive member and the first counter conductive member.

5. The semiconductor device according to claim 3, further comprising:

a third conductive member,
a position in the second direction of the third electrode being between a position in the second direction of the third conductive member and the position in the second direction of the portion of the first semiconductor region,
the third conductive member being electrically connected with the second electrode or being electrically connectable with the second electrode,
the third conductive member including a sixth end portion and a sixth other-end portion,
the sixth end portion in the first direction being between the first electrode and the sixth other-end portion,
a sixth distance along the first direction between the first electrode and the sixth end portion being less than the first distance,
a portion of the first insulating member being between the semiconductor member and the third conductive member.

6. The semiconductor device according to claim 5, further comprising:
a counter electrode,
the position in the second direction of the third conductive member being between the position in the second direction of the counter electrode and the position in the second direction of the third electrode,
the counter electrode being electrically connected with the third electrode.

7. The semiconductor device according to claim 1, wherein
a difference between the first distance and the second distance is not less than 0.1 times and not more than 5 times a length along the first direction of the third electrode.

8. The semiconductor device according to claim 7, wherein
the semiconductor member includes a boundary between the second semiconductor region and the portion of the first semiconductor region,
a fifth distance along the first direction between the first electrode and the boundary is greater than the second distance, and
an absolute value of the difference between the first distance and the second distance is not less than 0.1 times and not more than 10 times an absolute value of a difference between the fifth distance and the second distance.

9. The semiconductor device according to claim 1, wherein
the semiconductor member further includes a fourth semiconductor region of the second conductivity type,
the fourth semiconductor region is between the first conductive portion and at least a portion of the second semiconductor region, and
an impurity concentration of the second conductivity type in the fourth semiconductor region is greater than an impurity concentration of the second conductivity type in the second semiconductor region.

10. The semiconductor device according to claim 1, wherein
the semiconductor member further includes a fourth semiconductor region located between the first electrode and the first semiconductor region,
the fourth semiconductor region is of the first conductivity type, and
an impurity concentration of the first conductivity type in the fourth semiconductor region is greater than an impurity concentration of the first conductivity type in the first semiconductor region.

11. The semiconductor device according to claim 1, wherein
an impurity concentration of the first conductivity type in the third semiconductor region is greater than an impurity concentration of the first conductivity type in the first semiconductor region.

12. A semiconductor device, comprising:
a plurality of structures, each structure including:
a first electrode;
a second electrode including a first conductive portion, a direction from the first electrode toward the first conductive portion being along a first direction;
a third electrode;
a first conductive member, a second direction from the third electrode toward the first conductive member crossing the first direction, a position in the second direction of the first conductive portion being between a position in the second direction of the third electrode and a position in the second direction of the first conductive member, the first conductive member being electrically connected with the second electrode or being electrically connectable with the second electrode;
a semiconductor member, the semiconductor member including a first semiconductor region of a first conductivity type, a second semiconductor region of a second conductivity type, and a third semiconductor region of the first conductivity type, the second semiconductor region being region in the first direction between the third semiconductor region and a portion of the first semiconductor region, the second semiconductor region being in the second direction between the third electrode and the first conductive member, the first conductive portion being electrically connected with the second and third semiconductor regions, the first electrode being electrically connected with the first semiconductor region; and
a first insulating member, at least a portion of the first insulating member being between the semiconductor member and the third electrode and between the semiconductor member and the first conductive member,
the first conductive member including a first end portion and a first other-end portion,
the first end portion being in the first direction between the first electrode and the first other-end portion,
the third electrode including a second end portion and a second other-end portion,
the second end portion being in the first direction between the first electrode and the second other-end portion,
a shortest distance along the first direction between the first electrode and the first end portion being less than a shortest distance along the first direction between the first electrode and the second end portion,
the plurality of structures being arranged and repeatedly provided in the second direction.

* * * * *